United States Patent [19]

Pigeon et al.

[11] 4,299,905
[45] Nov. 10, 1981

[54] WATER-DEVELOPABLE FILM-FORMING DIAZONIUM COMPOUND CONTAINING PHOTOPOLYMERIZABLE COMPOSITIONS AND NEGATIVE-WORKING LITHOGRAPHIC PLATES PREPARED THEREFROM

[75] Inventors: Marcel Pigeon; Marta Szretter, both of Neuilly; Chantal Périé, Paris, all of France

[73] Assignee: Rhone-Poulenc Systems, Creteilcedex, France

[21] Appl. No.: 134,328

[22] Filed: Mar. 26, 1980

[30] Foreign Application Priority Data

Mar. 28, 1979 [FR] France ............................... 79 07746

[51] Int. Cl.³ .................. G03C 1/52; G03C 1/60; G03C 1/94
[52] U.S. Cl. .................................. 450/157; 430/175; 430/176; 430/280; 430/302
[58] Field of Search ............... 430/176, 175, 280, 157, 430/302

[56] References Cited

U.S. PATENT DOCUMENTS

| 3,199,981 | 8/1965 | Sus et al. | 430/175 |
|---|---|---|---|
| 3,205,157 | 9/1965 | Licari | 430/280 |
| 3,295,974 | 1/1967 | Erdmann | 430/280 |
| 3,396,019 | 8/1968 | Uhlig | 430/176 |
| 3,622,333 | 11/1971 | Cope | 430/176 |
| 3,660,097 | 5/1972 | Mainthia | 430/175 |
| 3,790,385 | 2/1974 | Steppan et al. | 430/176 |
| 3,794,576 | 2/1974 | Watt | 430/280 |
| 3,930,856 | 1/1976 | de Moira et al. | 430/176 |
| 4,092,170 | 5/1978 | Houtermans et al. | 430/175 |
| 4,093,465 | 6/1978 | Chu et al. | 430/175 |
| 4,104,072 | 8/1978 | Golda et al. | 430/175 |
| 4,218,531 | 8/1980 | Carlson | 430/280 |

Primary Examiner—Charles L. Bowers, Jr.
Attorney, Agent, or Firm—Sherman & Shalloway

[57] ABSTRACT

A film-forming oleophilic photopolymerizable composition is formed from a fluid epoxy resin having an epoxy equivalent of less than 350 and a photosensitive reaction product of a water-soluble, photosensitive condensation product of a diazonium compound and an organic condensation agent with an organic coupling agent. The organic coupling agent is selected such that the photosensitive reaction product is soluble in organic solvents but only slightly soluble in water. The photopolymerizable compositions can be used as the photosensitive layer of water-developable negative lithographic plates, such as printing plates.

Water-developable negative lighographic plates are also provided in which the photosensitive layer is formed from a layer of the film-forming oleophilic photopolymerizable composition which is deposited on a hydrophilic support from an organic solvent solution.

In addition to being water-developable the negative lithographic printing plates of the present invention have high mechanical resistance, long shelf-life and can be used in large production runs to make a great number of copies.

24 Claims, No Drawings

WATER-DEVELOPABLE FILM-FORMING DIAZONIUM COMPOUND CONTAINING PHOTOPOLYMERIZABLE COMPOSITIONS AND NEGATIVE-WORKING LITHOGRAPHIC PLATES PREPARED THEREFROM

BACKGROUND OF THE INVENTION (1) Field of the Invention

The present invention relates to film-forming, oleophilic photopolymerizable compositions, to the use of such compositions in formation of negative-working lithographic plates and to the negative-working lithographic plates, especially printing plates, so formed. More particularly, the present invention relates to negative-working photopolymerizable, film-forming, oleophilic compositions which are soluble in organic solvents and which are based on epoxy resins and photosensitive diazo compounds as cross-linking agents for the epoxy resins and to negative-working lithographic plates developable with water using layers of the film-forming oleophilic photopolymerizable compositions as the photosensitive layer.

(2) Discussion of the Prior Art

The lithographic printing technique for which the compositions of this invention are most particularly intended, is based on the principal of non-miscibility of greasy inks and water and by the formation on a suitable support of hydrophilic, oleophobic zones (i.e. retaining water and rejecting greasy ink) and hydrophobic, inkophilic zones (i.e. retaining greasy ink and rejecting water). After wetting the support with water, the greasy ink is applied to the entire surface and is held at the inkophilic zones but is rejected by the wet hydrophilic zones.

Therefore, lithographic printing plates are formed by a suitable support on which is coated a photosensitive layer. The photosensitive layers that are used in lithography are generally of two types:

positive working layer in which the zones unexposed to light are kept as image zones after development; and negative working layer in which the unexposed zones are eliminated by development and the exposed zones form a hard printing pattern.

The present invention is concerned with negative working photosensitive compositions and the lithographic plates using such negative working photosensitive compositions coated on an underlying hydrophilic support. In the case of the negative working lithographic plates, the plate is exposed to ultraviolet light through a negative having transparent zones and opaque zones. The photosensitive composition is polymerized and hardened in zones corresponding to the transparent zones of the negative. The unexposed zones, which correspond to the opaque zones of the negative, are then removed by a developer which does not attack the exposed zones thereby baring the underlying hydrophilic support. The exposed zones are the "image" zones which receive the greasy ink, while the unexposed zones are the "non-image" zones.

At present, most lithographic plates currently used in printing are of the presensitized type, i.e., coated with a photosensitive layer and ready to be exposed through an original (generally a transparent support partially covered with opaque zones) to be reproduced.

It is apparent that for negative working lithographic plates, especially printing plates in which the developed plate will be subjected to mechanical stresses and which are typically used for making large numbers of copies, often exceeding 50,000 or even 100,000 copies, it is essential to used photopolymerizable resins which have exceptional hardness and exceptional tenacity. It is known that epoxy resins are particularly well suited to this purpose.

French Pat. No. 2,011,413, to which U.S. Pat. No. 4,093,465 corresponds, describes negative photosensitive compositions which are soluble in organic solvents and which are formed as a mixture of a photosensitive and photohardenable product made up of a photosensitive, water-soluble condensation product of a diazonium compound and an organic condensation agent which is reacted with an organic coupling agent which makes this product insoluble in water, and an oleophilic, film-forming resin soluble in organic solvents.

Among the photosensitive diazonium compounds disclosed in these patents are the diazo aromatic compounds and especially p-diazo-diphenyl-amine and its derivatives, condensed with organic condensation agents having reactive carbonyl groups such as aldehydes and acetals and particularly formaldehyde and paraformaldehyde.

Among the coupling agents disclosed in these references for making these products less ionic and therefore essentially soluble in organic solvents are the aromatic acid compounds such as phosphinic, phosphonic, sulfonic and carboxylic acids derived from benzene, toluene, naphthalene and the derivatives thereof.

The synthetic resins to be mixed with these products are described to include substantially any of the resins which are known to be film-forming, oleophilic and insoluble in water. By way of non-limiting examples the references mention epoxy, phenolic, acrylic, polyamide, polystyrene, polyvinyl chloride, polyvinyl acetate, polyester, polyurethane resins.

It is further described in this French and corresponding U.S. Patent that the photopolymerizable compositions can be used for making lithographic plates which are developable with aqueous or substantially aqueous solutions.

It is known to be a great advantage to users of lithographic plates that the plates be as simple as possible to use, and therefore development with water for this purpose is highly desirable.

However, at the present time, negative working plates which are developable with water and which have a very long life have not been made practically available on a commercial scale. Actually, contrary to the teachings of the French and U.S. Patents cited above the lithographic plates with an epoxy resin base described in these references are not developable with water alone, as will be shown in the Comparative Examples given below.

U.S. Pat. No. 3,396,019 describes presensitized plates having a support of aluminum treated with a phosphonic acid or one of its derivatives, which is coated with a layer of oleophilic resin which is insoluble in water and a water-soluble condensation product of a diazonium compound, such as paradiazodiphenylamine condensed with formaldehyde in an acid medium. This reference also mentions epoxy resins among the resins that are suitable for making lithographic plates. However, the plates described in this patent have numerous drawbacks. First, the photopolymerizable composition as described in the embodiments of this patent is very difficult to make in practice. Second, the medium in which the mixture of the oleophilic resin and water-soluble condensation product is prepared is a partially aqueous medium since the diazonium compound used is soluble only in an aqueous medium. Since epoxy resins have a very poor affinity for water it is difficult to use the epoxy resins in such system.

Furthermore, in making the compositions as described in this patent, it has been found that the compositions precipitate very easily from the acid medium. Still further, these compositions are not film-forming and during coating in thin layers on a support, it has been found that separation of the constituents of the composition occurs, with the diazonium compound separating from the resin. Accordingly, these compositions are not industrially acceptable.

It is also known from U.S. Pat. No. 3,794,576 that monomer or prepolymer epoxy resins, which are fluid at ambient temperature, can be polymerized with certain diazonium salts such as hexafluorophosphates, tetrachloroferrates, hexachlorostannates, hexafluoroarsenates, hexafluoroantimonates, etc. These compositions can be used to make images with the unexposed portions being removed with suitable solvents.

However, as far as applicants are aware, there has not been described a photopolymerizable composition with an epoxy resin base, which is developable solely with water.

SUMMARY OF THE INVENTION

Accordingly, it is an object of the present invention to provide a film-forming, oleophilic photopolymerizable composition which is soluble in organic solvents and is suitable for use as the photosensitive layer of water-developable negative-working lithographic plates, especially lithographic printing plates, but also generally as a coating, for decoration of substrates and graphic arts due to their capability of forming mechanically strong and chemically resistant surfaces.

It is also an object of the present invention to provide a water-developable negative working lithographic plate formed from a hydrophilic support and a photosensitive layer of a photopolymerizable composition with an epoxy resin base which is developable with water without requiring other additives.

It is still a further object of the present invention to provide such photopolymerizable composition and negative working lithographic plate which is simple to prepare and simple to use and which has high mechanical strength and which has a very long life.

A further object of the present invention is to provide such photopolymerizable composition and negative working lithographic plate which has a long shelf life in addition to a long working life.

These and other objects of the present invention are accomplished by a film-forming, oleophilic photopolymerizable composition which is soluble in organic solvents and which is formed from (1) an epoxy resin forming monomer or prepolymer which is fluid at ambient temperature and which has an epoxy equivalent of less than about 350; and (2) a photosensitive reaction product of (a) a water soluble, photosensitive condensation product of (i) a diazonium compound and (ii) an organic condensation agent, and (b) an organic coupling agent. By suitable selection of the organic coupling agent the photosensitive reaction product (2) is soluble in organic solvents and only slightly soluble in water. Accordingly, when an organic solvent solution of the photopolymerizable composition is deposited on a hydrophilic support and imagewise exposed to ultraviolet light, the exposed zones are polymerized and hardened while the unexposed zones are easily removable by development with water, i.e. water washing.

Quite unexpectedly, it has now been found, in accordance with the present invention, that by using photopolymerizable compositions containing photosensitive reaction products, preferably derived from an aromatic diazonium compound, as described above, and an epoxy resin which is fluid at ambient temperature (the fluidity of the resin being enhanced in the absence of solvent) as the photosensitive layer on a suitable hydrophilic support in a negative working lithographic plate, the zones exposed to actinic light polymerize and are hardened while the unexposed zones can be removed by simple rinsing with flowing water. Such a feature has very important practical interest since the use of solvents or aqueous solutions containing a wetting agent for development of the latent image can be eliminated. Therefore, a lithographic plate coated with a layer of the photopolymerizable composition of this invention can be exposed, developed and dried in just a few minutes.

The present invention will now be described in greater detail in connection with the following description and accompanying examples.

DETAILED DESCRIPTION OF THE INVENTION AND PREFERRED EMBODIMENTS

The first essential component of the film-forming, oleophilic photopolymerizable compositions of this invention is an epoxy resin forming monomer or prepolymer which is fluid at ambient temperature and which has an epoxy equivalent of less than about 350. As used in the present specification and appended claims the term "ambient termperature" refers to the atmospheric temperature of the working environment and typically will be a temperature of at least about 15° C. and more typically will refer to a temperature in the range of from about 18° C. to about 30° C.

The fluidic nature of the epoxy resins used in the compositions of this invention can be defined in the same manner as in the above-mentioned U.S. Pat. No. 3,794,576, the disclosure of which is incorporated herein by reference. A specific method that can be used to define the fluidity limit of the epoxy resins useable in this invention, is, for example, the Durran method. According to this method the melting point of the epoxy resin is considered to be that temperature at which the molten resin reaches the summit of the mercury. This method is described in detail in "Analytic Chemistry of Polymers" Part I, pp. 155–156 edited by Goldon M. Kline, Interscience Publishers, Inc., New York.

In the present invention, according to the Durran measuring method, it is preferred that the fluid epoxy resins have a Durran melting point of about 38° C. or less, preferably about 37° C. or less and most preferably about 20° C. or less. The lower limit of the melting point measured by the Durran method is not particularly critical except that it is preferred, in general, to use fluid epoxy resins having a viscosity of at least about 5000 centipoises.

Epoxy resins having Durran melting points greater than 38° C. are too highly viscous to form uniformly smooth thin coating layers. On the other hand with fluid epoxy resins having a viscosity of less than about 5000 centipoises, it becomes difficult in certain cases to obtain a photopolymerizable layer which, after deposit on a support, is not sticky. This is also disadvantageous for obvious reasons including the difficulty in obtaining smooth layers as well as the risk of picking up dirt, etc.

In general, within the above noted limits, as the Durran melting point decreases the stability of the photosensitive composition and the lithographic plate coated with a layer of the photopolymerizable composition, increases. Thus, for epoxy resins having a Durran melting point below about 38° C. and above about 27° C. water development is possible only for a few days after coating to achieve the greatest clarity or sharpness in the reproduced images. For epoxy resins having a Durran melting point in the range of from about 20° C. to about 27° C. water development of the exposed photopolymerizable composition is possible for about ten days while still being able to obtain the greatest sharpness and clarity of reproduced lines from the original transparency.

With fluid epoxy resins having Durran melting points of about 20° C. or less photosensitive compositions and lithographic plates are obtained having a shelf life of several weeks and even several months or more and are still water developable after these extended storage periods. This is of course highly desirable in the case of presensitized lithographic plates such as lithographic offset plates.

The epoxy resins can be used alone or in mixtures to adjust their viscosity to fall within the limits described above. It is possible, for example, and it is advantageous in some cases, to use an epoxy resin with a viscosity less than 5000 centipoises in mixture with an epoxy resin with a higher viscosity to thereby obtain a mixture that can be developed with water for several months or even years. It is also possible, for example, to use a mixture of epoxy resins which include at least one resin with a viscosity less than about 5000 centipoises and at least one resin having a Durran melting point above 20° C. and still obtain photopolymerizable compositions which can be coated on a suitable support which can be exposed and developed with water alone to obtain faithful reproductions even after storage for several months or more. It is thus apparent that it will be possible for a man of ordinary skill in this art following the above teachings to develop all sorts of mixtures of epoxy resins depending on the desired purpose of the photopolymerizable composition. Again, reference is made to the discussion in U.S. Pat. No. 3,794,576 for more detailed discussion on the characteristics and mode of preparation of fluid epoxy resins.

It is another requirement of the epoxy resins of this invention that they have an epoxy equivalent of less than about 350. In the present application the epoxy equivalent of an epoxy resin is understood to be that weight, in grams, of the resin, that contains a gram-equivalent of epoxy groups. For epoxy resins having epoxy equivalents of more than about 350 the hardness and tenacity of the developed plates is insufficient. Preferably the epoxy resins have an epoxy equivalent less than or equal to about 200 since, to obtain the optimum degree of hardness, of the developed plate, it is preferred to have the greatest possible number of epoxy groups throughout the printing plate.

For a further detailed description of epoxy resins one can refer to pages 312-329 of the first supplement volume of "Encyclopedia of Chemical Technology" edited by Kirk and Othmer and published by Interscience Encyclopedia, Inc., New York, 1957 and pages 340-528 of the text "Epoxy Verbindungen Und Epoxyharz" edited by Paquin, published by Springler-Verlag, Berlin, Gottingen Und Heilderberg, 1958.

In general, suitable fluid epoxy resins for use in the compositions and lithographic plates of the present invention include glycidyl ethers of bisphenol A, novolac phenol or cresol epoxy resins, and the like. The diglycidyl ethers of bisphenol A are especially preferred.

By way of non-limiting example, mention can be made of the following fluid epoxy resins which are currently available on the market and which are especially suitable for use in the present invention:

ARALDITE grades GY 255, GY 260, EPN 1138 and EPN 1139, trademark products sold by CIBA GEIGY LTD;

EPON or EPIKOTE, grade nos. 827, 828, 834, etc., trademark products of the Shell Chemical Company.

The second essential component of the film-forming, oleophilic photopolymerizable compositions of this invention is a photosensitive reaction product of a particular water-soluble, photosensitive condensation product and an organic coupling agent. This photosensitive reaction product must be soluble in organic solvents and also soluble in water, but only slightly. This slight degree of solubility in water will be described in greater detail below but in general it is that degree of solubility which allows for the water development of the photopolymerizable composition which has been imagewise exposed to actinic radiation. The solubility in organic solvents is required so that a thin uniform layer of the photosensitive composition can be deposited on a support from a solvent solution.

The first component of the photosensitive reaction product is a water-soluble, photosensitive condensation product of a diazonium compound and an organic condensation agent. Generally, the diazonium compounds that can be used in the photosensitive products are water-soluble photosensitive products with negative functional groups such as aromatic diazo compounds and especially diazo arylamines which may be substituted on the aromatic ring or on the amino group. The most preferred diazonium compound is a paradiazodiphenylamine which is readily available commercially. In general, however the aromatic diazo compounds as disclosed in the above-mentioned U.S. Pat. Nos. 4,093,465 and 3,396,019 can be used as the aromatic diazo compounds in the compositions of the present invention and the disclosures of these references are incorporated herein by reference.

These diazonium compounds are condensed with organic condensation agents having reactive carbonyl groups and preferably are selected from aldehydes and acetals. Formaldehyde and paraformaldehyde are especially preferred organic condensation agents. The preparation of these water-soluble, photosensitive condensation products are described, for example, in the above-mentioned U.S. Patents and British Pat. No. 418,011.

Generally speaking, the reaction between the aromatic diazo compound and organic condensation agent is carried out in an aqueous medium in the presence of an acid condensing agent and at room temperature or while cooling. The acid condensing agent, may for example, be hydrochloric acid or sulfuric acid, or any of the other well known acid condensing catalysts. The amounts of the reactants and the time of the reaction are selected so that the resulting condensation product is water soluble.

The water-soluble, photosensitive condensation product is reacted with an organic coupling agent which is capable of changing the ionic character of the condensation product to yield a photosensitive reaction product which has good solubility in organic solvents but has only slight solubility in water. However, as will be described in greater detail below, it is an essential feature of this invention that the photosensitive reaction product not be totally insoluble in water but have slight water solubility. If this product is insoluble in water, the photopolymerizable composition cannot be developed with water.

As mentioned above, it is necessary to use organic coupling agents that tend to diminish the ionic character of the diazonium compounds so as to obtain a reaction product soluble in organic solvents and slightly soluble in water. It is possible during preparation of the reaction product in an aqueous medium to tell immediately whether this product is suitable or not in the photopolymerizable compositions of the invention: when an organic coupling agent is used that has one or more strong electronegative substituents, such as for example, a nitro or halogen group, a reaction product is obtained that immediately precipitates and which can be easily filtered. Such a product is insoluble in water and therefore is not suitable within the context of this invention: after application on a support, such compositions can be developed only with an aqueous acid solution. On the other hand, when the organic coupling agent is properly selected the resulting photosensitive reaction product precipitates during its preparation in the form of a paste that must then be redissolved in another solvent. Accordingly, one of ordinary skill will be able to readily determine by simple experimentation whether a particular organic coupling agent, and consequently the photosensitive reaction product, is suitable for this invention.

Preferably, arylsulfonic acids and, in particular, alkylaryl sulfonic acids are selected as the organic coupling agent. By "alkyl" is understood a carbon chain length of at most 10 carbon atoms, which may be substituted. Preferably, an alkylarylsulfonic acid will be used having one or more substituents selected from hydrogen, methyl and ethyl groups. The term "aryl" designates a simple or condensed aromatic ring. Preferably, however, a simple aromatic ring will be used, because it is possible, under certain circumstances, not to obtain a very easy water development with condensed aromatic rings. Again, this can readily be determined by simple and routine experimentation.

For example, it has been found that mono or polysulfonic acids of naphthalene, which may optionally be substituted, are less desirable as the organic coupling agent of condensed paradiazodiphenylamine formaldehyde since water development in this specific case is very difficult. For this reason, as a general rule, it is preferred to select the coupling agent from benzene sulfonic, toluene sulfonic and dimethylbenzenesulfonic acids, preferably 2, 5-dimethylbenzenesulfonic acid.

It has also been found that the choice of the substituent on the aromatic ring of the arylsulfonic coupling acid has a direct influence on the properties of the photosensitive reaction product, i.e., on the behavior of the salt of this acid with the diazo compound, e.g., paradiazodiphenylamine, condensed with a condensation product as defined above and on the development of the photopolymerizable composition according to the invention.

Without wishing to be bound by any particular theory, applicants have found that the influence of the substituents on the functional (reactive) groups is represented by the Hammet equation:

$$\rho\sigma = \log (K/Ko)$$

wherein Ko and K are reaction rate constants, $\sigma$ is the substituent coefficient (Hammet $\sigma$ constant) and $\rho$ is the coefficient of a defined reaction.

The Hammet $\sigma$ constant, as referred to in the present invention, is a parameter of the degree of reactivity of a substitution reaction on a group bonded to a nuclear carbon atom at a certain position of an aromatic group (for example, a benzene nucleus) or on the nuclear carbon atom, as is described in detail in "Physical Organic Chemistry", G. P. Hammet, McGraw-Hill Book Company, Inc. (1940). This degree of reactivity is affected by the degree of electron attractability or electron donatability of substituents attached to the other positions of the aromatic group.

The Hammet $\sigma$ constant, as referred to in the present invention, is an arithmetic sum of the Hammet $\sigma$ constants of the electron-attracting groups and electron-donating groups bonded to the aromatic group, which are determined by the positions and types of these groups.

When it is difficult to calculate a Hammet $\sigma$ constant of a given aromatic ring structure if values for the substituents are not found in the above book or other literature references, the above parameters can be actually measured by the method disclosed at pages 81 to 103 to the above book.

According to this equation, the electron-attracting substituent groups have a positive $\sigma$ coefficient in relation to hydrogen whose coefficient is equal to 0, while the electron-donating substituent groups have a negative coefficient in relation to hydrogen.

The following table gives the value of $\sigma$ for several substituents:

| Substituents | Value of Hammet $\sigma$ constant |
|---|---|
| H | 0 |
| p . Cl | +0.227 |
| p . Br | +0.232 |
| p . $NO_2$ | +0.778 |
| m . $NO_2$ | +0.710 |
| p . $CH_3$ | −0.170 |
| p . $OC_2H_5$ | −0.250 |
| p . $OCH_3$ | −0.268 |
| p . $C_2H_5$ | −0.151 |
| m . $CH_3$ | −0.069 |
| p . i . $C_3H_7$ | −0.151 |
| p . tert $C_4H_9$ | −0.197 |
| 3,4-di ($CH_3$) | −0.229 |

Applicants have found that substituent groups having an Hammet $\sigma$ constant of 0 or less than zero (negative), i.e., hydrogen or electron-donating groups are suitable for use in the present invention.

The reaction between the water-soluble photosensitive condensation product, typically a condensation product of paradiazodiphenylamine with paraformaldehyde, which is currently available in the commercial market and therefore preferred for use in this invention, and the organic coupling agent, preferably the arylsulphonic acid, is carried out by mixing with vigorous agitation aqueous solutions of the condensation product and coupling agent in the presence of additional acid, preferably an inorganic acid, such as phosphoric acid, to provide an acidic pH of from about 4,5 to about 2,3, preferably from about 3,5 to about 3.

The additional acid is preferably added to an aqueous solution of the diazo condensation product and this acid solution is slowly added to an aqueous solution of the arylsulphonic acid with vigorous mixing which is continued until all of the acid solution has been added. The reaction is allowed to proceed at room temperature, although temperature of from about 18° C. to about 30° C. are suitable. The reaction may be continued after the stirring is finished. Generally, reaction times of from about 30 minutes to about 2 hours are suitably used.

The amounts of the condensation product and organic coupling agent are selected to provide a molar ratio of from 1 to 1,3 and preferably 1 to 1.

When the resulting photosensitive reaction product that is obtained precipitates in the form of a sticky paste (the coefficient $\sigma$ of the arylsulfonic acid substituent used, if any, then being zero or negative), this indicates that the photosensitive reaction product is slightly soluble in water and that it is suitable within the context of this invention.

The paste is then separated from the reaction mixture and then redissolved in a solvent, which makes it possible to obtain a solution that is stable for several dozen days. The product can be obtained in solid form by precipitating the above solution with a suitable solvent.

Examples of the first-mentioned solvent in the preceeding paragraph for redissolving the paste include, for example, ethylene glycol monomethyl ether (methylcellosolve) and dimethylformamide.

Examples of the second-mentioned solvent for precipitating the redissolved paste include, for example, isopropanol and acetone.

The photopolymerizable compositions of the invention are prepared by combining the epoxy resin and the photosensitive reaction product, generally from organic solutions of each component. Alternatively, the epoxy resin and photosensitive reaction product can be combined in the dry state by simple mixing.

The photopolymerizable compositions according to the invention are generally applied to a support from an organic solvent solution of one or more organic solvents. To obtain a layer that is not sticky at ambient temperature so that the layer can be touched without marking or damaging it, it is generally necessary to make compositions comprising 40 to 70% by weight, preferably 45 to 60% by weight of the photosensitive reaction product and 30 to 60% by weight, preferably 40 to 55% by weight of epoxy resin, on a dry basis.

To make it possible for the operator to see the parts of the negative-working layer that have been exposed, polymerized and cross-linked, there can be incorporated in the photopolymerizable composition according to the invention one or more colored indicators which become colored in an acid medium. Preferably, so as not to hinder the water development of the latent image, it is preferable to limit the weight of the dye to at most 10% by the weight of the photopolymerizable composition. In a general way, an amount less than 5% by weight is perfectly suitable. To obtain an easy development with running water, it is advisable not to deposit too thick a layer of photopolymerizable composition according to the invention. It has been found in a general manner that excellent results are obtained by depositing 0.5 g/m$^2$ to 2 g/m$^2$ of photopolymerizable layer and preferably 1 g/m$^2$ to 1.5 g/m$^2$, on a dry basis.

When too thin a layer of photopolymerizable sensitive layer is deposited, there is obviously the danger, especially when the support exhibits a certain roughness (lithographic plates in particular) of not having a sufficiently homogeneous and constant layer on the entire support. At deposition amounts greater than 2 g/m$^2$ it becomes difficult at times to remove the unexposed layer with water alone.

The most important application of the photopolymerizable compositions of this invention is as the photosensitive layer of negative-working lithographic plates, preferably presensitized plates.

In this case, a hydrophilic support will be chosen from the supports well known to a man of the art, such as chromium, aluminum, possibly anodized, stainless steel, tinned steel, polyester whose surface has been made hydrophilic, and the like. The photopolymerizable composition is deposited on the support within the amounts specified above by techniques well known in this art.

After exposure through a suitable mask, e.g. a semitransparent negative, according to procedures well known in the art the unexposed parts are removed by simple rinsing with water, for example from a sprayer or directly from the tap. The quality of the resulting plate is exceptional as will be seen from the following examples.

The invention will be better understood from the following non-limiting examples of specific embodiments of the invention.

EXAMPLE 1

Synthesis of condensed paradiazodiphenyl formaldehyde paratoluenesulfonate

There are placed 26 g of p. toluenesulfonic acid and 150 ml of distilled water in a three-neck flask equipped with a powerful stirrer and a separating funnel.

There is slowly added with vigorous stirring a solution of 36 g of Fairmount diazo No. 4 (which is condensed paradiazodiphenylamine formaldehyde sulfate) in 300 ml of water and 50 ml of 10% phosphoric acid. The product precipitates as a sticky paste on the flask walls. At the end of the addition, the reaction is allowed to continue for 30 minutes, then the liquid part is decanted and the residue in the flask is washed twice with 200 ml of distilled water.

The paste is dissolved in 600 g of ethylene glycol monomethyl ether (Methylcellosolve). The solution is stable at ambient temperature. To obtain the solid product, the above solution is precipitated in isopropanol. After filtering and drying under vacuum at ambient temperature, 40 g of solid product is obtained.

Preparation of a lithographic plate:

3 g of novolac epoxy resin 1139 of the CIBA GEIGY Company and 0.1 g of methyl red dye are dissolved in 62 g of Methyl cellosolve. There are added thereto 33 g of a 6% solution of the condensed p. diazodiphenylamine formaldehyde p. toluene sulfonate as prepared above in Methylcellosolve. The epoxy resin 1139 has an epoxy equivalent between 172 and 179 and a viscosity of 1700 cps at 52° C. and a Durran melting temperature of 18° C.

On a chromed, coppered steel plate, treated with gum arabic, degummed, rinsed, then dried, is coated the above solution with a whirler at 50 rpm for 30 seconds.

The layer is dried in the whirler for 5 minutes at 40° C., then in an oven for 5 minutes at 85° C. The weight of the deposited layer is 15 g/m². The plate thus treated is exposed through a negative under a 2 KW NUARC type arc lamp, 60 cm distant for 1 minute. A violet image, visible in white light and inactinic light, is obtained.

The plate is developed under a stream of water; the unexposed parts swell and are carried off. The development is finished with slight rubbing with a pad.

The quality of the resulting copy is excellent. The various halftone commercial scales are used to measure this quality:

the UGRA scale represents the various halftone areas of the offset screen of 60 lines and 120 lines per cm. The scale comprises 12 areas reproducing all the points from 4% to 96% of the surface covered, covering the whole range of halftones to be reproduced which are encountered in printing.

The FOGRA scale, on the other hand, makes it possible to measure with precision the resolution power of the plate, because it comprises positive and reserve (negative) lines whose thicknesses are measured in microns: 4, 6, 8, 10, etc.

The UGRA scale copied on the plate of this example is perfectly reproduced in all the values including the finest points of the 120-line/cm screen.

Also 4-micron positive lines of the FOGRA scale and 6-micron negative lines are obtained.

The plate locked on the press gave no sign of wear after 75,000 impressions.

EXAMPLE 2

There is prepared under the same conditions as in example 1 a photosensitive solution containing 2 g of novolac epoxy resin 1139 of the CIBA GEIGY Company, and 0.5 g of methyl red dye in 45 g of Methylcellosolve; there are added thereto 50 g of a 6% solution of condensed p. diazo diphenylamine formaldehyde p. toluene sulfonate in Methylcellosolve.

A layer of this solution is deposited on a chromed, coppered plate treated in the same way as in example 1 (weight deposited: 1.5 g/m²).

After exposure of the plate to actinic light through a semitransparent negative original, it is developed with water as in example 1. The same results are obtained as in example 1, in particular the 6-micron positive and negative lines of the FOGRA scale.

EXAMPLE 3

There is prepared under the same conditions as in example 1 a photosensitive solution containing 3 g of ARALDITE 260 resin of the CIBA GEIGY Company, and 0.075 g of methyl red in 62 g of Methylcellosolve and to this solution there is added 33 g of a 6% solution of condensed diazodiphenylamine formaldehyde p. toluene sulfonate in Methylcellosolve.

The ARALDITE 260 epoxy resin has an epoxy equivalent between 185 and 196, a viscosity of 12,000 to 16,000 cps at 25° C. and a Durran melting point of 10° C.

This solution is applied to an anodized aluminum plate treated for offset use, dried before coating, under the same conditions as in example 1.

After exposure, the plate is developed with water as in example 1.

The same results are obtained as in example 1.

EXAMPLE 4

There is prepared under the same conditions as in example 1 a photosensitive solution containing 2 g of ARALDITE 255 resin of the CIBA GEIGY Company, and 0.1 g of methyl red dye in 45 g of methylcellosolve. There are added thereto 50 g of a 6% solution of condensed p. diazodiphenylamine formaldehyde p. toluene sulfonate.

The ARALDITE 255 epoxy resin has an epoxy equivalent between 180 and 200, a viscosity of 5,000 to 6,000 cps at 25° C. and a Durran melting point of 5° C.

This solution is applied under the same conditions as in example 1 to a chromed tinned steel plate, as described in U.S. patent application Ser. No. 10,398, filed Feb. 8, 1979 to Pigeon and de Maguillé and having the same assignee as the present invention. After exposure, the plate is developed with water under the same conditions as in example 1. The same results are obtained as in example 1.

EXAMPLE 5

There is prepared under the same conditions as in example 1 a photosensitive solution containing 2 g of EPIKOTE 828 resin of the Shell Oil Company, and 0.075 g of methyl red in 45 g of methylcellosolve. There are added thereto 50 g of a 6% solution of condensed p. diazophenylamine formaldehyde p. toluene sulfonate in methylcellosolve.

The EPIKOTE 828 has an epoxy equivalent between 184 and 194, a viscosity of 10,000 to 15,000 cps at 25° C. and a Durran melting point of 10° C.

This solution is applied to a chromed steel plate treated in the same way as for example 1 (weight deposited: 1.5 g/m²).

After exposure, it is developed with water as in example 1. The same results as in example 1 are obtained.

EXAMPLE 6

There is prepared under the same conditions as for example 1 a photosensitive solution containing 1 g of novolac 1139 epoxy resin of the CIBA GEIGY Company and 2 g of EPIKOTE 827 resin of Shell Company, and 0.5 g of methyl red in 60 g of methylcellosolve.

The EPIKOTE 827 resin has an epoxy equivalent between 180 and 190, a viscosity between 8,000 and 12,000 cps at 25° C. and a Durran melting point of 7° C.

There are added thereto 33 g of a 6% solution of condensed p. diazodiphenylamine formaldehyde sulfonate in methylcellosolve. This solution is applied to a chromed coppered steel plate treated as in example 1. The same procedure as in example 1 is followed and the same results are obtained.

EXAMPLE 7

Synthesis of condensed p. diazodiphenylamine formaldehyde benzene sulfonate 24 g of sodium benzenesulfonate, 200 ml of water and 200 ml of 10% phosphoric acid are introduced into a three-necked flask with a powerful stirrer and separating funnel.

A solution of 36 g of Fairmont diazo No. 4 in 360 ml of water is added with vigorous stirring. The product precipitates in the form of a sticky paste. The liquid part is decanted and the residue is washed with distilled water.

The product is dissolved in 600 g of ethylene glycol monomethyl ether. To obtain the solid product, it is precipitated in isopropanol and dried under vacuum.
Preparation of a lithographic plate:

3 g of novolac 1139 epoxy resin and 0.1 g of 4-phenylazo diphenylamine are dissolved in 95 g of methylcellosolve and there are added 2 g of condensed p. diazodiphenylamine formaldehyde benzene sulfonate: a 5% photosensitive solution of solid is obtained in methylcellosolve.

The resulting solution is coated on a chromed support, exposed and developed in water as in example 1. The same results are obtained.

EXAMPLE 8

Synthesis of condensed p. diazodiphenylamine formaldehyde 2,5-dimethylbenzene sulfonate There are introduced 28.8 g of 2,5-dimethylbenzene sulfonic acid, 200 ml of water and 50 ml of 10% phosphoric acid into a three-necked flask equipped with a powerful stirrer and a separating funnel. To this mixture there is added a solution of 36 g of Fairmount diazo No. 4 in 360 ml of water. The product precipitates in the form of a sticky paste which is washed with distilled water.

The product is dissolved in 600 g of ethylene glycol monomethyl ether to obtain a ready-to-use solution.

If it is desired to obtain a solid product, it must be precipitated in isopropanol and dried under vacuum.
Preparation of a lithographic plate:

2.5 g of EPN 1139 resin and 0.1 g of methyl red dye are dissolved in 55.5 g of methylcellosolve. There is added thereto 42 g of a 6% solution of condensed p.diazodiphenylamine formaldehyde 2,5-dimethylbenzene sulfonate.

This solution is applied to a chromed steel plate and the plate is exposed and developed as in example 1.

There is obtained a visible violet image that develops perfectly with water. The quality of the copy is excellent: in particular the 6-micron positive and negative lines of the FOGRA scale are very clear.

COMPARATIVE EXAMPLE 1

This example corresponds to the teaching of U.S. Pat. No. 3,396,019.

A photosensitive solution is prepared containing 0.4 g of condensate of 3.3 g of paraformaldehyde and 29 g of 4-diazodiphenylamine sulfate in 42 g of 85% phosphonic acid without separation of the phosphonic acid and 0.8 g of EPIKOTE 1001 epoxy resin of the Shell Oil Company in 86 g of methylcellosolve and 5 g of water. This solution is applied to a chromed support in a whirler at 50 rpm for 30 seconds then the resulting plate is dried for 5 min at 40° C. then 4 minutes at 85° C. in an oven.

The plate thus treated is exposed through a negative mask on a plateholder of the Nu Arc 2-KW type for 1-min, the exposure distance being 60 cm.

Passage of water over the plate does not cause any development. The plate is then developed with an aqueous solution containing 8% gum arabic. The unexposed parts partially dissolve: the diazonium salt comes off but the epoxy resin remains anchored to the support. This is noticed at the time of inking the plate which becomes completely black without any distinction between the "image" and "non-image" zones, because of the presence of the inkophilic epoxy resin on the entire plate. The results are identical on an anodized aluminum plate: the epoxy resin is not removed from the "non-image" zones by the aqueous developer made up of water and 8% gum arabic.

COMPARATIVE EXAMPLE 2

(This example corresponds to the teaching of French Pat. No. 2,011,413.)

The following solution is prepared:

| | |
|---|---|
| EPON 1031 resin (solid resin of Shell Oil Company) | 2 g |
| Condensed p . diazodiphenylamine formaldehyde 2-hydroxy-4-methoxybenzophenone-5-sulfonate | 5 g |
| Methyl cellosolve | 93 g |

This solution is coated on a chromed support at a rate of approximately 1.5 g/m$^2$, then dried for 5 min at 40° C. and for 5 min at 85° C.

The resulting plate is exposed for 1 min through a negative mask with a 2-KW Nu Arc type plateholder. The exposure distance is 60 cm.

When the plate is subjected to the action of a stream of water no development is noted. If an aqueous developer containing about 20% lauryl sulfate type wetting agent is used, an elimination of the unexposed zones is obtained after mechanical action of a pad for 3 min. However, it was also noted that the layer in the exposed zones was also partially eliminated, which gave poor quality copy with many flaws.

COMPARATIVE EXAMPLE 3

(This example also corresponds to the teaching of French Pat. No. 2,011,413.)

The following solution is prepared:

| | |
|---|---|
| EPIKOTE 1001 resin (resin of Shell Chemical Company) | 2 g |
| Condensed p . diazodiphenylamine formaldehyde 2-hydroxy-4-methoxybenzophenone-5-sulfonate | 5 g |
| Methylcellosolve | 93 g |

This solution is deposited on a chromed support at a rate of approximately, 1.5 g/m$^2$, then dried as in the preceding example. The plate is then exposed through a negative as in the preceding example.

The action of a stream of water and a pad does not permit the development of the plate.

As in the preceding example, the plate is developed with an aqueous developer containing 20% of a lauryl-sulfate wetting agent, with mechanical action of a pad. The quality of the resulting image is poor as in the preceding example.

COMPARATIVE EXAMPLE 4

(This example corresponds to the teaching of U.S. Pat. No. 4,104,072.)

The following solution A is prepared:

| | |
|---|---|
| Condensed paradiazodiphenylamine paraformaldehye chlorozincate | 2 g |
| Water | 50 g |
| Methanol | 50 g |

Then the following solution B is prepared:

| Condensed paradiazodiphenylamine formaldehyde 2-hydroxy-4-methoxybenzophone-5-sulfonate | 1 g |
|---|---|
| EPON 1031 epoxy resin | 2 g |
| Methylcellosolve | 91 g |

Solution A is deposited at a rate of about 1.5 g/m² on an anodized aluminum support treated for use in lithography. After drying of the layer, there is deposited at a rate of about 1.5 g/m² solution B which is then dried as in the preceding examples. Exposure of the plate is done through a negative for 2 min., as in the preceding example. The plate is then subjected to the action of a stream of water and a pad: no development is noted.

COMPARATIVE EXAMPLE 5

(This example also corresponds to the teachings of U.S. Pat. No. 4,104,072.)

The same test as in example 10 is performed, replacing EPON 1031 resin with EPON 1007 resin. The same negative results are obtained.

COMPARATIVE EXAMPLE 6

The following solution is prepared:

| EPIKOTE 1007 resin (solid resin of Shell Chemical Company) | 2 g |
|---|---|
| Condensed p . diazophenylamine formaldehyde p . toluene sulfonate | 4 g |
| Methylcellosolve | 94 g |

This solution is deposited on a chromed support then exposed under the same conditions as in Comparative Example 1.

By the action of a stream of water and a pad, the diazonium salt is removed from the unexposed zones but the resin remains in said zones, even after 5 min of development. When the plate is covered with black ink, a uniform black surface is obtained, without distinction between the "image" and "non-image" zones.

COMPARATIVE EXAMPLE 7

In the same way, there is prepared a photosensitive solution containing 3 g of novolac 1139 epoxy resin, 95 g of methylglycol and 2 g of fluorborate salt of 3,6-diethoxy-4-morpholino-fluor-diazobenzene. This solution is applied as in the preceding examples. After exposure, development with water is impossible, and a solution of about 20% phosphoric acid has to be used. However, the exposed parts are fragile and partially eliminated.

COMPARATIVE EXAMPLE 8

The same procedure as in Comparative Example 5 is followed but by preparing the preceding diazo p.toluene sulfonate salt. The same negative result is obtained.

It is evident that the photopolymerizable compositions according to the invention are also applicable to making washoff type lithographic plates and in all cases where such a process is used (for more details on such a process see the work "Light Sensitive Systems" by J. Kosar, pp.114–118).

The photopolymerizable compositions described above are, of course, polymerizable by electromagnetic radiation of suitable wavelength (electron beam).

On the other hand, it has been found that the photopolymerizable compositions according to the invention cannot be used on a support such as copper, because they cannot be developed with water in this case.

What is claimed is:

1. A film-forming oleophilic photopolymerizable composition which is soluble in organic solvents and is suitable for use as the photosensitive layer of water-developable negative-working lithographic plate, said composition consisting essentially of,
   (1) 30% to 60% by weight of at least one epoxy resin forming monomer or prepolymer, said epoxy resin or mixture of epoxy resins being fluid at ambient temperature and having an epoxy equivalent of less than about 350, a Durran melting point of about 38° C. or less and a viscosity of at least about 5000 centipoises at 25° C.; and
   (2) 40% to 70% by weight of a photosensitive reaction product of
   (a) a water-soluble, photosensitive condensation product of (i) a diazonium compound and (ii) an organic condensation agent, and
   (b) an organic coupling agent;
   wherein said photosensitive reaction product (2) is soluble in organic solvents and only slightly soluble in water,
   whereby when an organic solvent solution of said composition is deposited on a hydrophilic support, and imagewise exposed to ultraviolet light, the exposed zones are polymerized and hardened and the unexposed zones are easily removable by washing with water alone.

2. The photopolymerizable composition according to claim 1, wherein the epoxy resin or mixture thereof has an epoxy equivalent less than or equal to 200.

3. The photopolymerizable composition according to claim 1 or 2 wherein the melting point of the epoxy resin or mixture thereof measured by the Durran method is less than or equal to 27° C.

4. The photopolymerizable composition according to claim 1 or 2 wherein the melting point of the epoxy resin or mixture thereof measured by the Durran method is less than or equal to 20° C.

5. The photopolymerizable composition according to claim 2 wherein the epoxy resin is at least one member selected from the group consisting of glycidyl ethers of bisphenol A, phenol novolac epoxy resins and cresol novolac epoxy resins.

6. The photopolymerizable composition according to claim 2 wherein the epoxy resin is a diglycidyl ether of bisphenol A.

7. The photopolymerizable composition according to any one of claims 1, 2, 5 or 6 wherein the diazonium compound is a diazoarylamine compound.

8. The photopolymerizable composition according to claim 7 wherein the diazonium compound is paradiazodiphenylamine or a photosensitive negative-working derivative thereof.

9. The photopolymerizable composition according to claim 1 wherein the organic condensation agent contains reactive carbonyl groups.

10. The photopolymerizable composition according to claim 1 wherein the organic condensation agent is an aldehyde or acetal.

11. The photopolymerizable composition according to claim 1 wherein the organic condensation agent is formaldehyde or paraformaldehyde.

12. The photopolymerizable composition according to claim 1 wherein the organic coupling agent is an arylsulfonic acid.

13. The photopolymerizable composition according to claim 12 wherein the arylsulfonic acid has one or more substituents on the aryl nucleus, wherein the Hammet $\sigma$ constant of the substituents is negative or zero.

14. The photopolymerizable composition according to claim 13 wherein the substituents are alkyl or alkoxy substituents.

15. The photopolymerizable composition according to claim 12 wherein the arylsulfonic acid has one or more substituents selected from H, $CH_3$ or $C_2H_5$.

16. The photopolymerizable composition according to claim 1 wherein the organic coupling agent is selected from the group consisting of benzenesulfonic, toluenesulfonic and dimethylbenzene sulfonic acids.

17. The photopolymerizable composition according to claim 1 which comprises 45% to 60% by weight of the photosensitive reaction product and 40% to 55% by weight of the epoxy resin or mixture thereof.

18. The photopolymerizable composition according to claim 1 which further comprises a colored indicator which is colorless in a basic medium and which is able to become colored in an acidic medium.

19. The photopolymerizable composition according to claim 18 which comprises up to 10% by weight of the colored indicator in relation to the total weight of said composition.

20. The photopolymerizable composition according to claim 18 which comprises at most 5% by weight of colored indicator.

21. A water-developable negative lithographic plate comprising
   I. a hydrophilic support, and
   II. a photosensitive layer coated on said support, wherein said photosensitive layer is a layer of the oleophilic, photopolymerizable composition of claim 1.

22. The lithographic plate according to claim 21 wherein the weight of the photosensitive layer deposited on the support is between 0.5 $g/m^2$ and 2 $g/m^2$.

23. The lithographic plate according to claim 21 wherein the weight of the photosensitive layer deposited on the support is between 1 $g/m^2$ and 1.5 $g/m^2$.

24. The lithographic plate according to one of claims 21, 22 or 23 wherein the hydrophilic support is selected from the group consisting of chromium, aluminum, anodized aluminum, tin, steel, tin-plated steel and hydrophilic polyester.

* * * * *